(12) United States Patent
Kurz et al.

(10) Patent No.: US 6,897,371 B1
(45) Date of Patent: May 24, 2005

(54) ONE-PIECE SHIELDING ENCLOSURE WITH SELECTIVE INTERIOR ACCESS, AND METHOD AND BLANK THEREFOR

(75) Inventors: Arthur A. Kurz, New Vernon, NJ (US); Wayne R. Dunn, Sussex, NJ (US)

(73) Assignee: A K Stamping Co. Inc., Mountainside, NJ (US)

( * ) Notice: Subject to any disclaimer, the term of this patent is extended or adjusted under 35 U.S.C. 154(b) by 457 days.

(21) Appl. No.: 10/229,331

(22) Filed: Aug. 27, 2002

(51) Int. Cl.[7] ................................................. H05K 9/00
(52) U.S. Cl. .............................. 174/35 GC; 174/35 R; 361/816
(58) Field of Search ........................ 174/35 R, 35 GC; 361/816, 818, 800

(56) References Cited

U.S. PATENT DOCUMENTS

| | | |
|---|---|---|
| 4,754,101 A | 6/1988 | Stickney et al. |
| 5,175,395 A | 12/1992 | Moore |
| 5,365,410 A * | 11/1994 | Lonka .......................... 361/816 |
| 5,422,433 A | 6/1995 | Rivera et al. |
| 5,614,694 A | 3/1997 | Gorenz, Jr. et al. |
| 5,886,879 A | 3/1999 | Matuschik |
| 6,136,131 A | 10/2000 | Sosnowski |
| 6,178,097 B1 * | 1/2001 | Hauk, Jr. ..................... 361/816 |
| 6,384,324 B2 * | 5/2002 | Flegeo .................. 174/35 GC |
| 6,552,261 B2 * | 4/2003 | Shlahtichman et al. ... 174/35 R |

* cited by examiner

*Primary Examiner*—Hung V. Ngo
(74) *Attorney, Agent, or Firm*—Arthur Jacob (57) ABSTRACT

A shielding enclosure has an access opening for enabling selective access to a component placed in the shielding enclosure, a closure member and a connector section selectively expansible and contractible to enable the closure member to be captured within the access opening upon expansion of the connecting section to complete shielding of the component and to be disengaged from the access opening upon contraction of the connecting section. In the preferred construction, the connecting section is in the form of a perforated web having beams oriented oblique to the directions of expansion and contraction, and the shielding enclosure is made in one piece from a single blank of shielding material.

35 Claims, 5 Drawing Sheets

ONE-PIECE SHIELDING ENCLOSURE WITH SELECTIVE INTERIOR ACCESS, AND METHOD AND BLANK THEREFOR

The present invention relates generally to electromagnetic shielding enclosures and pertains, more specifically, to a shielding enclosure having an access opening and a closure for ready selective access to the interior of the enclosure, and a method and blank for constructing the enclosure.

Electromagnetic shielding enclosures find widespread use in the construction of electronic circuits wherein various components of such circuits must be shielded from one another and from immediate surroundings to prevent deleterious effects of uncontrolled radiation. For example, current wireless telephonic devices include many components packed tightly within a compact electronic apparatus and it becomes essential that at least some of these components be shielded effectively to prevent radio frequency radiation from one component to interfere with the operation of another component, and to prevent deleterious radiation entering the vicinity immediately surrounding the device.

Shielding enclosures currently in use in such devices usually are secured to a circuit board, or the like, as by soldering or otherwise mechanically affixing a shielding enclosure to the circuit board to surround and shield a component mounted on the circuit board. A problem arises, however, should it become necessary to gain access to the surrounded and shielded component for repair or replacement once the shielding enclosure is secured in place. Removing a soldered or otherwise secured shielding enclosure from a circuit board to gain access to a shielded component becomes time-consuming and expensive. Various solutions to the problem have been proposed, usually in the form of shielding enclosures constructed for selective access to the interior of the enclosure without the necessity for releasing and removing the enclosure from the circuit board.

The present invention provides a shielding enclosure, together with a method and a blank for making the shielding enclosure, which accomplishes selective access to the interior of a shielded enclosure for repair or replacement of a shielded component therein, with improved ease and economy. As such, the present invention attains several objects and advantages, some of which are summarized as follows: Provides a shielding enclosure having an access opening and a closure arranged for ease of opening and closing to attain ready access to an enclosed, shielded component, while assuring integrity of the shield enclosure when closed; enables increased economy in the construction and use of a shielding enclosure; provides an economical, one-piece construction in a versatile shielding enclosure having selective access to the interior of the shielding enclosure without the necessity for releasing or removing the enclosure from a secured position on a circuit board; allows selective access to the interior of a shielding enclosure without the necessity for special skills; attains a high degree of shielding performance while enabling ease of selected access to the interior of a shielding enclosure; allows the permanent attachment of a shielding enclosure to a circuit board without concern for detachment should it become necessary to gain access to the interior of the shielding enclosure subsequent to attachment; simplifies the manufacture of a shielding enclosure which allows selective access to the interior of the enclosure subsequent to installation; provides a shielding enclosure which exhibits exemplary performance over an extended service life.

The above objects and advantages, as well as further objects and advantages, are attained by the present invention which may be described briefly as a shielding enclosure for shielding a component to be located within the shielding enclosure and enabling selective access to the component when located in the shielding enclosure, the shielding enclosure comprising: a frame having a peripheral wall surrounding an interior for locating the component within the shielding enclosure; an access opening bounded by the peripheral wall and extending longitudinally and laterally for providing selective access to the interior of the shielding enclosure and the component located therein; a closure member selectively captured in and released from the access opening for selectively closing and opening the access opening, the closure member having a peripheral edge for confronting the peripheral wall of the frame when the closure member is captured in the access opening; a connecting section for joining the closure member with the peripheral wall of the frame, the connecting section being selectively extensible and contractible in longitudinal directions; interengagable elements along the peripheral edge of the closure member and the confronting wall of the frame for being interengaged in response to selective extension of the connecting section so as to capture the closure member within the access opening and complete the shielding of the component within the interior of the shielding enclosure, and for being disengaged in response to selective contraction of the connecting section so as to release the closure member for movement in an altitudinal direction out of the access opening to open the access opening for access to the component located within the interior of the shielding enclosure.

In addition, the invention includes a method for making a shielding enclosure for shielding a component to be located within the shielding enclosure and enabling selective access to the component, the method comprising: forming a blank from a sheet of shielding material, the blank having a frame section extending in a plane and including a peripheral flange section; an access opening bounded by the frame section and extending longitudinally and laterally within the plane; a closure section within the access opening, the closure section having a peripheral edge confronting corresponding portions of the frame section; a connecting section joining the closure section with the frame section, the connecting section being selectively extensible and contractible in longitudinal directions within the plane; and interengagable elements along the peripheral edge of the closure section and the confronting portions of the frame section; bending the flange portions altitudinally out of the plane to form peripheral walls and establish an interior within which the component will be located for shielding; and extending the connecting section within the plane, longitudinally relative to the frame section, so as to interengage the interengagable elements and capture the closure section within the access opening, thereby completing a shielding structure in the shielding enclosure.

Further, the invention includes a blank for making a shielding enclosure for shielding a component to be located within the shielding enclosure and enabling selective access to the component, the blank comprising a sheet of shielding material having: a frame section extending in a plane and including a peripheral flange section; an access opening bounded by the frame section and extending longitudinally and laterally within the plane; a closure section within the access opening, the closure section having a peripheral edge confronting corresponding portions of the frame section; a connecting section joining the closure section with the frame section, the connecting section being selectively extensible and contractible in longitudinal directions within the plane; and interengagable elements along the peripheral edge of the closure section and the confronting portions of the frame section.

The invention will be understood more fully, while still further objects and advantages will become apparent, in the following detailed description of preferred embodiments of the invention illustrated in the accompanying drawing, in which:

Figure 1:
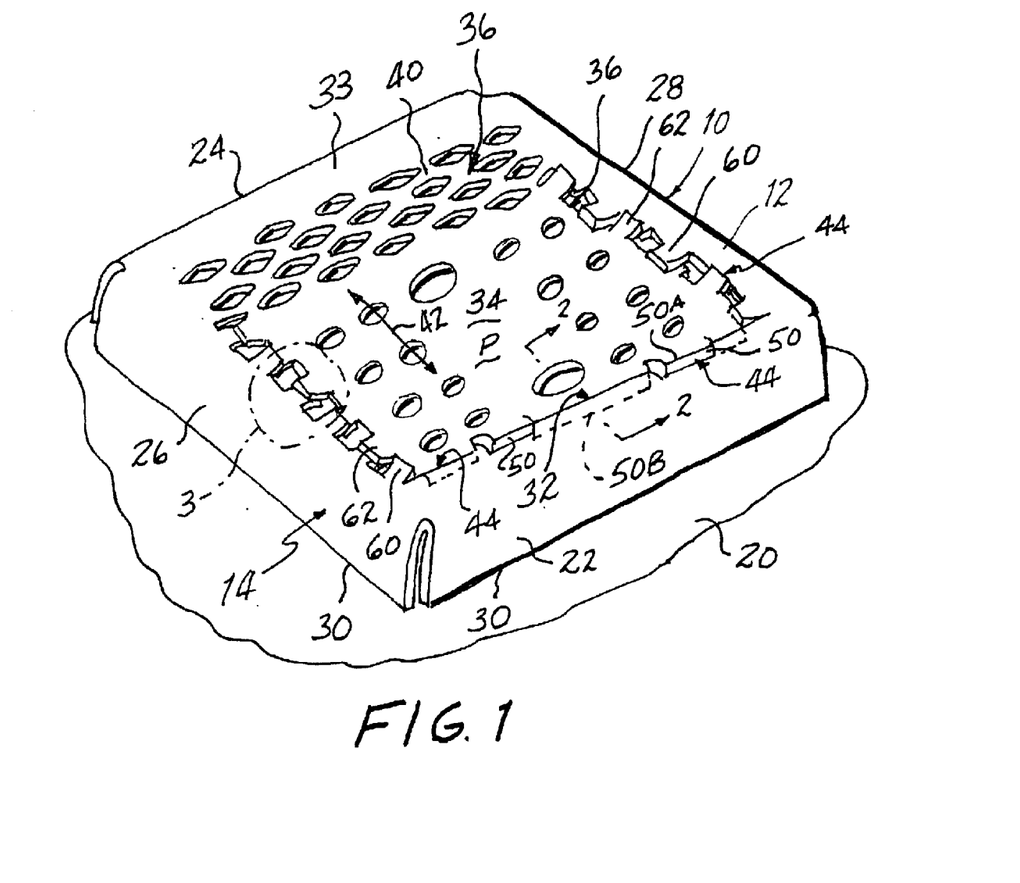
FIG. 1 is a top, front and side isometric view of a shielding enclosure constructed in accordance with the present invention.

Referring now to the drawing, and especially to FIG. 1 thereof, a shielding enclosure constructed in accordance with the present invention is shown at 10 and is seen to include a frame 12 having a peripheral wall 14 surrounding an interior 16 (see FIG. 5) within which a component 18 will be located upon installation of the shielding enclosure 10 on a circuit board 20. Peripheral wall 14 includes a forward wall 22, a rearward wall 24 longitudinally opposite the forward wall 22, and laterally opposite side walls 26 and 28. In a typical installation, walls 22, 24, 26 and 28 are affixed to the circuit board 20, as by soldering along the lower edge 30 of each wall 22, 24, 26 and 28.

Once the shielding enclosure 10 is secured to the circuit board 20, access to the interior 16, and the component 18 therein, for repair or replacement of the component 18, is attained through an access opening 32 provided at the top 33 of the shielding enclosure 10, as will be described below, access opening 32 extending longitudinally between the forward wall 22 and the rearward wall 24, and laterally between the side walls 26 and 28. As shown in FIG. 1, however, access opening 32 is closed by a closure member 34 in order to complete the shielding of component 18 as provided by shielding enclosure 10.

In order to close access opening 32 and enable selective access to the interior 16 of the shielding enclosure 10, closure member 34 is selectively captured in and released from access opening 32. To this end, closure member 34 extends longitudinally and laterally in a plane P coincident with access opening 32 and includes a peripheral edge 36 for confronting the peripheral wall 14 of the frame 12 when the closure member 34 is captured in the access opening 32, and a connecting section 36 enables joining of the closure member 34 with the peripheral wall 14 of the frame 12. In the embodiment of the invention illustrated in FIG. 1, the connecting section 36 is in the form of a perforated web 40 integral with the closure member 34 and the rearward wall 24 for joining the closure member 34 to the frame 12. The perforated web 40 is extensible and contractible in longitudinal directions 42, as will be described in greater detail below.

Figure 2:
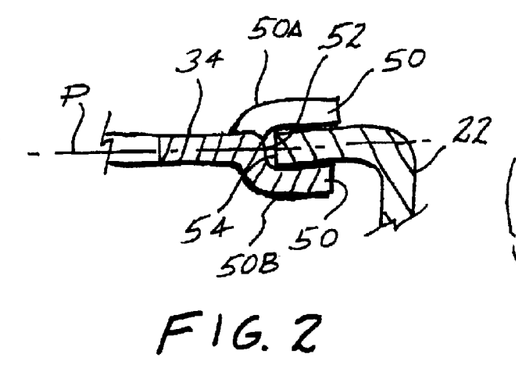
FIG. 2 is an enlarged fragmentary cross-sectional view taken along line 2—2 of FIG. 1.
Figure 3:
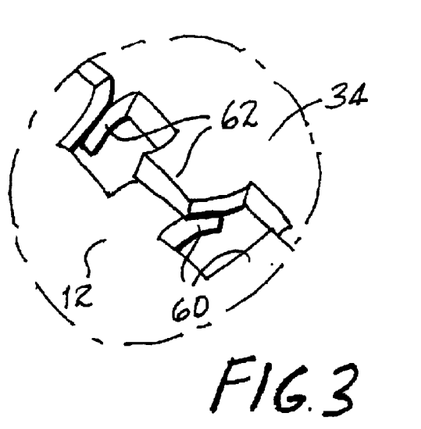
FIG. 3 is an enlarged fragmentary isometric view of a portion of FIG. 1, indicated at 3 in FIG. 1.

Turning now to FIGS. 2 and 3, as well as to FIG. 1, interengagable elements 44 are placed along the peripheral edge 36 of the closure member 34 and the confronting forward wall 22 and side walls 26 and 28 of the peripheral wall 14 of frame 12 to capture the closure member 34 within the access opening 32 and complete the shielding of the component 18 within the interior 16 of shielding enclosure 10. Interengagable elements 44 include locking fingers 50 spaced laterally along forward edge 52 of the closure member 34, the locking fingers 50 projecting longitudinally from the forward edge 52 toward the forward wall 22, and a locking ledge 54 extending longitudinally and laterally along the forward wall 22. The locking fingers 50 are diverted altitudinally from the plane P of the closure member 34 so as to overlap the locking ledge 54 of the forward wall 22 to capture the closure member 34 within the access opening 32 and to contact the forward wall 22 to complete the shielding of the component 18. In the preferred illustrated construction, adjacent locking fingers 50 are diverted in opposite altitudinal directions, as shown at 50A and 50B, to secure the closure member 34 essentially within plane P.

Interengagable members 44 further include first tabs 60 projecting laterally inwardly from the side walls 26 and 28 toward the access opening 32, and second tabs 62 projecting from the peripheral edge 36 of the closure member 34 laterally outwardly toward corresponding side walls 26 and 28. In the preferred arrangement, first tabs 60 and second tabs 62 are diverted altitudinally relative to one another so as to overlap and engage one another to capture the closure member 34 within the access opening 32, essentially within plane P, and to complete the shielding of component 18. In the preferred arrangement illustrated in FIG. 3, adjacent first tabs 60 are diverted in opposite altitudinal directions and adjacent second tabs 62 are diverted in opposite altitudinal directions to attain the desired overlap and engagement.

Figure 4:
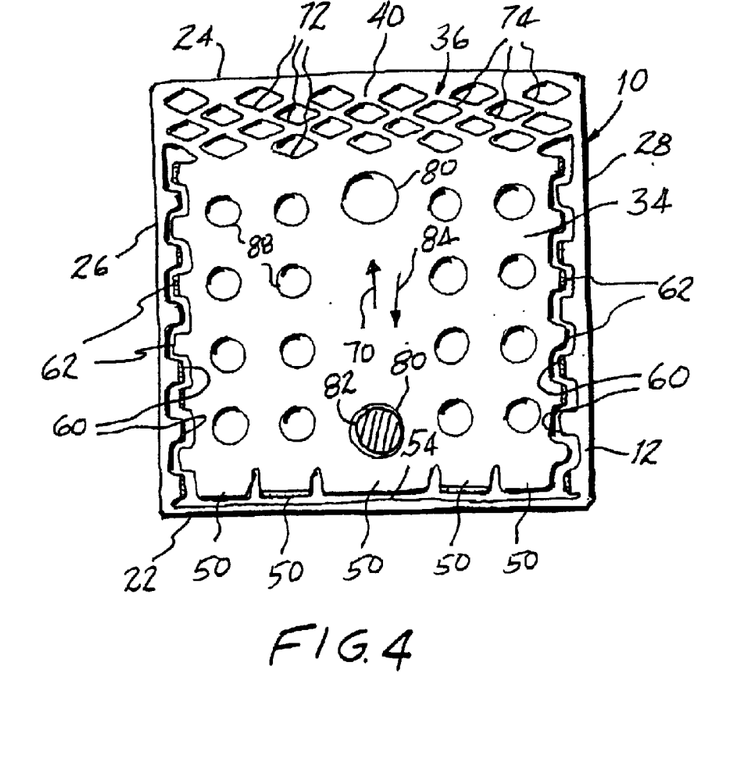
FIG. 4 is a top plan view of the shielding enclosure with the parts thereof in another operating position.
Figure 5:
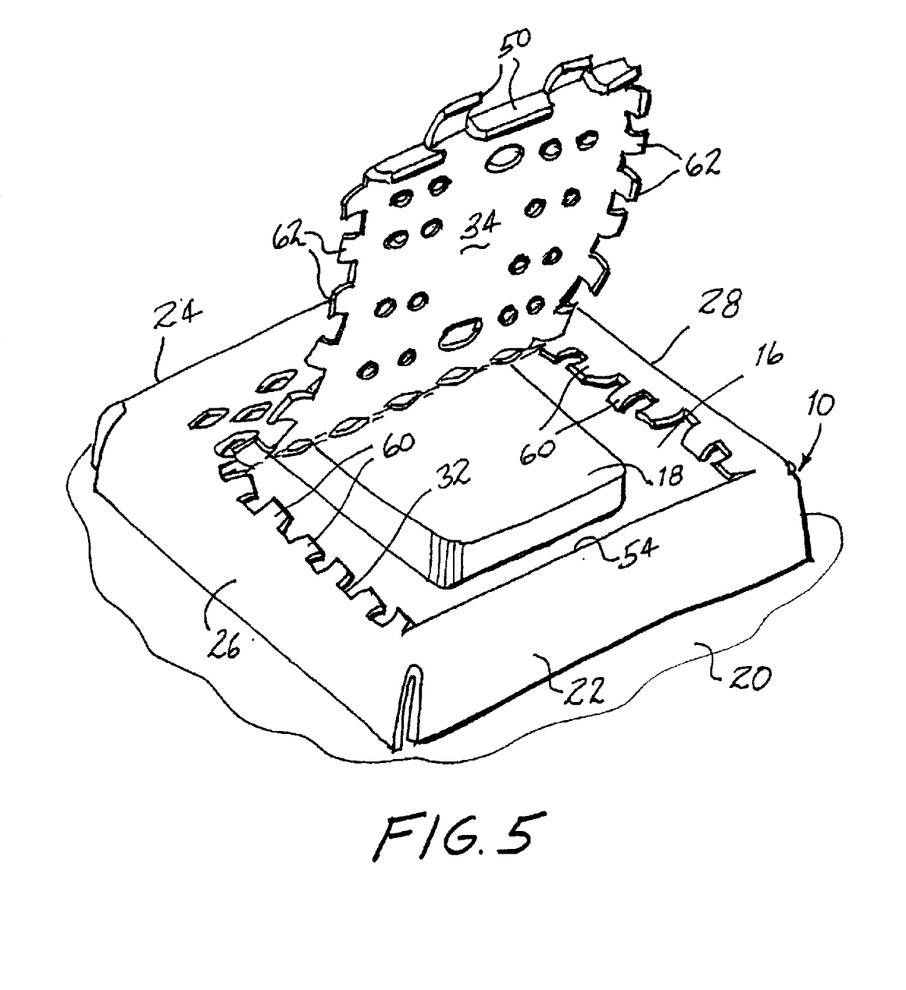
FIG. 5 is an isometric view similar to FIG. 1 and showing the shielding enclosure open for access to the interior thereof.

Referring now to FIGS. 4 and 5, should it become necessary to gain access to the interior 16 of the installed shielding enclosure 10, the closure member 34 merely is retracted, in the longitudinal direction shown at 70 in FIG. 4, until the locking fingers 50 are disengaged from the locking ledge 54 and the second tabs 62 are moved to positions between the first tabs 60, wherein the first and second tabs 60 and 62 merely are interdigitated. Such retraction of the closure member 34 is enabled by the ability of the connecting section 36 to be contracted. Thus, the perforated web 40 includes a pattern of perforations 72 which establishes beams 74 extending in directions oblique to the longitudinal direction 70 so that beams 74 bend in response to movement of the closure member 34 in the longitudinal direction 70, enabling retraction of the closure member 34 to the disengaged position illustrated in FIG. 4. Then, the closure member 34 is lifted altitudinally out of plane P, and out of the access opening 32, as shown in FIG. 5, with the connecting section 36 flexing to provide a hinge for such movement, until access is gained to the component 18.

Retraction of the closure member 34 is facilitated by the provision of tool-engagement sockets shown in the form of apertures 80 in the closure member 34. Thus, a simple implement 82 merely is engaged within an aperture 80 to enable the closure member 32 to be pulled back into the retracted, disengaged position shown in FIG. 4, and then to be lifted into the open, access position shown in FIG. 5. Once repair or replacement of component 18 is complete, access opening 32 is closed by merely reversing the above procedure; that is, closure member 34 is returned to plane P to be placed within the access opening 32, with tabs 60 and 62 interdigitated, and then is advanced, in longitudinal direction 84, to interengage tabs 60 and 62 with one another and locking fingers 50 with locking ledge 54. Where the shielding enclosure is to be soldered to circuit board 20, holes 88 may be provided in closure member 34 for permitting the flow and dissipation of heat during the soldering process.

Figure 6:
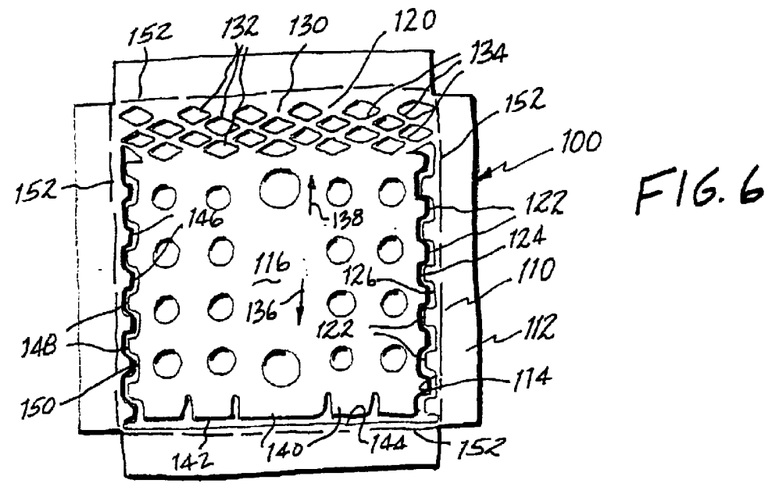
FIG. 6 is a plan view of a blank used for the construction of the shielding enclosure of FIG. 1.

The construction of shielding enclosure 10 lends itself to economical manufacture. As seen in FIG. 6, shielding enclosure 10 preferably is made unitary, in one piece, from a single blank 100 punched, cut, chemically etched or otherwise severed from a sheet of shielding material such as, for example, a sheet of stainless steel having a thickness of about 0.008 inch. Blank 100 includes a frame section 110 lying generally within the plane of the paper and having a flange section 112, an access opening 114 bounded by the frame section 110 and extending longitudinally and laterally within the plane of the paper, and a closure section 116 within the access opening 114. A connecting section 120 joins the closure section 116 with the frame section 110 and interengagable elements 122 are placed along the peripheral edge 124 of the closure section 116 and confronting portions 126 of the frame section 110.

The connecting section 120 is in the form of a perforated web 130 having a pattern of perforations 132. Perforations 132 have a generally diamond shape and establish beams 134 which extend in directions oblique to longitudinal directions 136 and 138. Connecting section 120 is rendered expansible and contractible by the ability of the beams 134 to bend in response to forces tending to move closure section 116 in the longitudinal directions 136 and 138. In this manner, closure section 116 readily is moved in longitudinal directions 136 and 138 relative to frame section 110.

Interengagable elements 122 include fingers 140 projecting longitudinally from and spaced laterally along a forward edge 142 of the closure section 116, and a ledge 144 extending laterally along the frame section 110. Interengagable elements 122 further include tabs 146 projecting laterally inwardly from the frame section 110 and tabs 148 projecting laterally outwardly from side edges 150 of the closure section 116, between the tabs 146 so that the tabs 146 and 148 are interdigitated, as shown.

Shielding enclosure 10 is completed from blank 100 by bending flange section 112 to form the peripheral wall 14 to establish the forward wall 22, the rearward wall 24, the side walls 26 and 28, and the interior 16 of the shielding enclosure 10. Bending is accomplished along bend lines 152 and the material of the blank 100 is permanently deformed to establish the peripheral wall 14. The fingers 140 are permanently deformed in altitudinal directions to establish the diverted locking fingers 50, and the tabs 146 and 148 are permanently deformed in altitudinal directions to establish the first and second tabs 60 and 62. The closure section 116 then is pulled in the longitudinal direction 136, as enabled by the expansible connecting section 120, and serves as closure member 34 secured in place in access opening 32 by the interengagement of locking fingers 50 with locking ledge 54 and the interengagement of first and second tabs 60 and 62, in response to movement of the closure member 34 in longitudinal direction 136. The shielding enclosure 10 is thus closed and shielding of the component 18 is completed. Should it become necessary to open the shielding enclosure 10, the closure member 34 is merely retracted, in the longitudinal direction 138, as described above, as enabled by the contractible construction of the connecting section 120.

Figure 7:
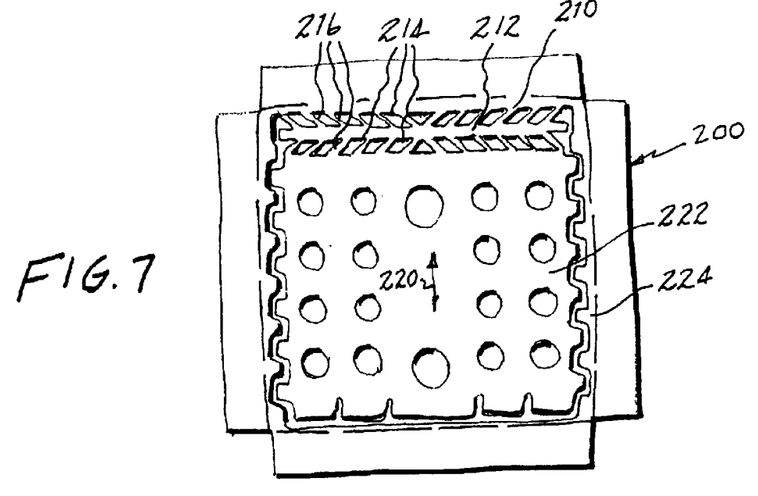
FIG. 7 is a plan view of another blank illustrating an alternate construction.

In an alternate construction illustrated in FIG. 7, a blank 200 is similar to blank 100 with the exception that a connector section 210 is configured in the form of a perforated web 212 including a pattern of rhombus-like perforations 214 establishing beams 216 extending in directions oblique to longitudinal directions 220. Beams 216 bend in response to longitudinal movements of closure section 222 relative to frame section 224 to render connector section 210 expansible and contractible.

Figure 8:
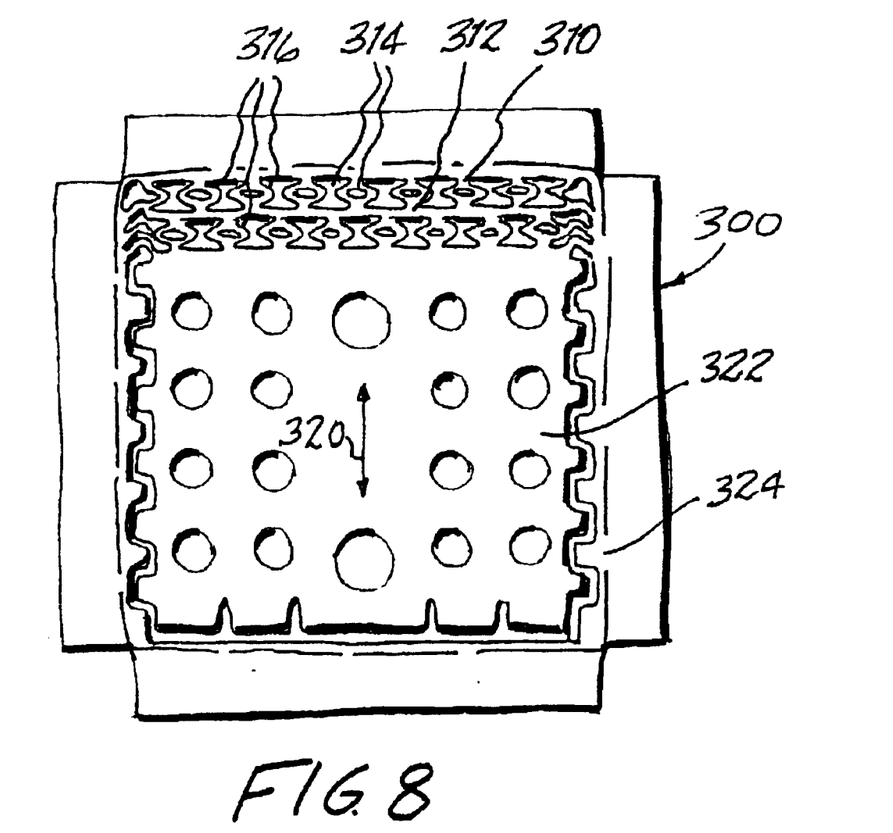
FIG. 8 is a plan view of still another blank illustrating another alternate construction.

In another alternate construction illustrated in FIG. 8, a blank 300 is similar to blank 100 with the exception that a connector section 310 is in the form of a perforated web 312 including a pattern of perforations 314 establishing loop-shaped beams 316 extending in directions oblique to longitudinal directions 320. Beams 316 bend in response to longitudinal movements of closure section 322 relative to frame section 324 to render connector section 310 expansible and contractible.

It will be seen that the present invention attains the several objects and advantages summarized above, namely: Provides a shielding enclosure having an access opening and a closure arranged for ease of opening and closing to attain ready access to an enclosed, shielded component, while assuring integrity of the shield enclosure when closed; enables increased economy in the construction and use of a shielding enclosure; provides an economical, one-piece construction in a versatile shielding enclosure having selective access to the interior of the shielding enclosure without the necessity for releasing or removing the enclosure from a secured position on a circuit board; allows selective access to the interior of a shielding enclosure without the necessity for special skills; attains a high degree of shielding performance while enabling ease of selected access to the interior of a shielding enclosure; allows the permanent attachment of a shielding enclosure to a circuit board without concern for detachment should it become necessary to gain access to the interior of the shielding enclosure subsequent to attachment; simplifies the manufacture of a shielding enclosure which allows selective access to the interior of the enclosure subsequent to installation; provides a shielding enclosure which exhibits exemplary performance over an extended service life.

It is to be understood that the above detailed description of preferred embodiments of the invention is provided by way of example only. Various details of design, construction and procedure may be modified without departing from the true spirit and scope of the invention, as set forth in the appended claims.

What is claimed is:

1. A shielding enclosure for shielding a component to be located within the shielding enclosure and enabling selective access to the component when located in the shielding enclosure, the shielding enclosure comprising:

a frame having a peripheral wall surrounding an interior for locating the component within the shielding enclosure;

an access opening bounded by the peripheral wall and extending longitudinally and laterally for providing selective access to the interior of the shielding enclosure and the component located therein;

a closure member selectively captured in and released from the access opening for selectively closing and opening the access opening, the closure member having a peripheral edge for confronting the peripheral wall of the frame when the closure member is captured in the access opening;

a connecting section for joining the closure member with the peripheral wall of the frame, the connecting section being selectively extensible and contractible in longitudinal directions;

interengagable elements along the peripheral edge of the closure member and the confronting wall of the frame for being interengaged in response to selective extension of the connecting section so as to capture the closure member within the access opening and complete the shielding of the component within the interior of the shielding enclosure, and for being disengaged in response to selective contraction of the connecting section so as to release the closure member for movement in an altitudinal direction out of the access opening to open the access opening for access to the component located within the interior of the shielding enclosure.

2. The invention of claim 1 wherein the connecting section comprises a perforated web configured for selective extension and contraction in the longitudinal directions.

3. The invention of claim 2 wherein the perforated web includes a pattern of perforations establishing beams connected to the closure member and extending oblique to the longitudinal directions for bending in the longitudinal directions to enable extension and contraction of the connecting section in the longitudinal directions.

4. The invention of claim 3 wherein the connecting section is unitary with the closure member and with the frame.

5. The invention of claim 1 wherein:
the peripheral wall includes a forward wall, a rearward wall, and side walls extending between the forward wall and the rearward wall;
the peripheral edge includes a forward edge confronting the forward wall and side edges confronting corresponding side walls of the frame;
the connecting section joins the closure member with the peripheral wall of the frame at the rearward wall, the connecting section being selectively extensible in a first longitudinal direction toward the forward wall of the frame and selectively contractible in a second longitudinal direction, opposite to the first longitudinal direction, away from the forward wall.

6. The invention of claim 5 wherein the connecting section comprises a perforated web configured for selective extension and contraction in the first and second longitudinal directions, respectively.

7. The invention of claim 6 wherein the perforated web includes a pattern of perforations establishing beams connected to the closure member and to the frame, the beams extending oblique to the longitudinal directions for bending in the longitudinal directions to enable extension and contraction of the connecting section in the longitudinal directions.

8. The invention of claim 6 wherein the interengagable elements are located along the forward edge of the closure member and along the forward wall of the frame.

9. The invention of claim 8 wherein the interengagable elements include locking fingers spaced laterally along the forward edge of the closure member and projecting longitudinally from the forward edge, and a locking ledge extending longitudinally and laterally along the forward wall, the locking fingers being diverted altitudinally from the closure member for overlapping engagement with the locking edge upon extension of the connecting section to capture the closure member in the access opening and complete the shielding of the component located within the interior of the shielding enclosure, and for withdrawal from the locking edge upon contraction of the connecting section to release the closure member from the access opening for access to the component located within the interior of the shielding enclosure.

10. The invention of claim 9 wherein adjacent locking fingers are diverted in opposite altitudinal directions.

11. The invention of claim 5 wherein the interengagable elements are located along the side walls of the frame and along corresponding side edges of the closure member.

12. The invention of claim 11 wherein the interengagable elements include first tabs projecting laterally from the side walls toward the access opening and second tabs projecting laterally from the closure member toward corresponding side walls, the first and second tabs being spaced longitudinally and at least some of the tabs being diverted altitudinally relative to others of the tabs such that the first and second tabs overlap and engage one another upon extension of the connecting section to capture the closure member in the access opening and complete the shielding of the component within the interior of the shielding enclosure, and are interdigitated upon contraction of the connecting section to release the closure member for movement out of the access opening.

13. The invention of claim 12 wherein adjacent first tabs are diverted altitudinally in opposite altitudinal directions and adjacent second tabs are diverted altitudinally in opposite altitudinal directions.

14. The invention of claim 5 wherein the interengagable elements are located along the forward edge and along the side edges of the closure member and along the forward wall and along the side walls of the frame.

15. The invention of claim 14 wherein the interengagable elements include locking fingers spaced laterally along the forward edge of the closure member and projecting longitudinally from the forward edge, and a locking ledge extending longitudinally and laterally along the forward wall, the locking fingers being diverted altitudinally from the closure member for overlapping engagement with the locking edge upon extension of the connecting section to capture the closure member in the access opening and complete the shielding of the component located within the interior of the shielding enclosure, and for withdrawal from the locking edge upon contraction of the connecting section to release the closure member from the access opening for access to the component located within the interior of the shielding enclosure.

16. The invention of claim 15 wherein adjacent locking fingers are diverted in opposite altitudinal directions.

17. The invention of claim 16 wherein the interengagable elements include first tabs projecting laterally from the side walls toward the access opening and second tabs projecting laterally from the closure member toward corresponding side walls, the first and second tabs being spaced longitudinally and at least some of the tabs being diverted altitudinally relative to others of the tabs such that the first and second tabs overlap and engage one another upon extension of the connecting section to capture the closure member within the access opening and complete the shielding of the component within the interior of the shielding enclosure, and are interdigitated upon contraction of the connecting section to release the closure member for movement out of the access opening.

18. The invention of claim 17 wherein adjacent first tabs are diverted altitudinally in opposite altitudinal directions and adjacent second tabs are diverted altitudinally in opposite altitudinal directions.

19. The invention of claim 18 wherein the connecting section is unitary with the closure member and with the frame.

20. A method for making a shielding enclosure for shielding a component to be located within the shielding enclosure and enabling selective access to the component, the method comprising:
forming a blank from a sheet of shielding material, the blank having
a frame section extending in a plane and including a peripheral flange section;
an access opening bounded by the frame section and extending longitudinally and laterally within the plane;
a closure section within the access opening, the closure section having a peripheral edge confronting corresponding portions of the frame section;
a connecting section joining the closure section with the frame section, the connecting section being selectively extensible and contractible in longitudinal directions within the plane; and
interengagable elements along the peripheral edge of the closure section and the confronting portions of the frame section;

bending the flange portions altitudinally out of the plane to form peripheral walls and establish an interior within which the component will be located for shielding; and extending the connecting section within the plane, longitudinally relative to the frame section, so as to interengage the interengagable elements and capture the closure section within the access opening, thereby completing a shielding structure in the shielding enclosure.

21. The method of claim 20 including perforating the connecting section to render the connecting section selectively extensible and contractible in the longitudinal directions.

22. The method of claim 21 wherein the connecting section is perforated to form a pattern of perforations establishing beams extending in directions oblique to the longitudinal directions and bendable to enable extension and contraction of connecting section in the longitudinal directions.

23. The method of claim 20 wherein:

the peripheral walls include a forward wall, a rearward wall, and side walls extending between the forward wall and the rearward wall;

the peripheral edge includes a forward edge confronting the forward wall and side edges confronting corresponding side walls of the frame;

the connecting section joins the closure section with the peripheral wall of the frame at the rearward wall, the connecting section being selectively extensible in a longitudinal direction toward the forward wall of the frame; and the interengagable elements include locking fingers spaced laterally along the forward edge of the closure section and projecting longitudinally from the forward edge, and a locking ledge extending longitudinally and laterally along the forward wall;

the method including deforming the locking fingers altitudinally out of the plane for enabling overlapping engagement with the locking edge upon extension of the connecting section to capture the closure section in the access opening and complete the shielding provided by the shielding enclosure.

24. The method of claim 23 including deforming adjacent locking fingers in opposite altitudinal directions.

25. The method of claim 23 wherein:

the interengagable elements include first tabs projecting laterally from the side walls toward the access opening and second tabs projecting laterally from the closure section toward corresponding side walls, the first tabs being interdigitated with the second tabs;

the method including deforming at least some of the tabs out of the plane in an altitudinal direction such that the first and second tabs overlap and engage one another upon extension of the connecting section to capture the closure section within the access opening and complete the shielding structure provided by the shielding enclosure.

26. The method of claim 25 including deforming adjacent first tabs out of the plane in opposite altitudinal directions and deforming adjacent second tabs out of the plane in opposite altitudinal directions.

27. The method of claim 25 including perforating the connecting section to render the connecting section selectively extensible and contractible in the longitudinal directions.

28. The method of claim 27 wherein the connecting section is perforated to form a pattern of perforations establishing beams extending in directions oblique to the longitudinal directions and bendable to enable extension and contraction of connecting section in the longitudinal directions.

29. A blank for making a shielding enclosure for shielding a component to be located within the shielding enclosure and enabling selective access to the component, the blank comprising a sheet of shielding material having:

a frame section extending in a plane and including a peripheral flange section;

an access opening bounded by the frame section and extending longitudinally and laterally within the plane;

a closure section within the access opening, the closure section having a peripheral edge confronting corresponding portions of the frame section;

a connecting section joining the closure section with the frame section, the connecting section being selectively extensible and contractible in longitudinal directions within the plane; and interengagable elements along the peripheral edge of the closure section and the confronting portions of the frame section.

30. The blank of claim 29 including perforations in the connecting section for rendering the connecting section selectively extensible and contractible in the longitudinal directions.

31. The blank of claim 30 wherein the perforations are located in a pattern of perforations establishing beams extending in directions oblique to the longitudinal directions, the beams being bendable to enable extension and contraction of the connecting section.

32. The blank of claim 29 wherein:

the frame section includes a forward wall section, a rearward wall section, and side wall sections extending between the forward wall section and the rearward wall section;

the peripheral edge includes a forward edge confronting the forward wall section and side edges confronting corresponding side wall sections of the frame section;

the connecting section joins the closure section with the frame section at the rearward wall section, the connecting section being selectively extensible in a longitudinal direction toward the forward wall section of the frame section; and the interengagable elements include locking fingers spaced laterally along the forward edge of the closure section and projecting longitudinally from the forward edge, and a locking ledge extending longitudinally and laterally along the forward wall section.

33. The blank of claim 32 wherein the interengagable elements include first tabs projecting laterally from the side wall sections toward the access opening and second tabs projecting laterally from the closure section toward corresponding side wall sections, the first tabs being interdigitated with the second tabs.

34. The blank of claim 33 including perforations in the connecting section for rendering the connecting section selectively extensible and contractible in the longitudinal directions.

35. The blank of claim 34 wherein the perforations are located in a pattern of perforations establishing beams extending in directions oblique to the longitudinal directions, the beams being bendable to enable extension and contraction of the connecting section.

* * * * *